US006855977B2

(12) United States Patent
Krieger et al.

(10) Patent No.: US 6,855,977 B2
(45) Date of Patent: Feb. 15, 2005

(54) MEMORY DEVICE WITH A SELF-ASSEMBLED POLYMER FILM AND METHOD OF MAKING THE SAME

(75) Inventors: Juri H. Krieger, Brookline, MA (US); N. F. Yudanov, Brookline, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 111 days.

(21) Appl. No.: 10/139,745

(22) Filed: May 7, 2002

(65) Prior Publication Data

US 2002/0163828 A1 Nov. 7, 2002

Related U.S. Application Data

(60) Provisional application No. 60/289,054, filed on May 7, 2001.

(51) Int. Cl.[7] .......................... H01L 29/76; H01L 29/94; H01L 29/40
(52) U.S. Cl. ....................... 257/311; 257/314; 257/315; 257/771
(58) Field of Search ................................ 257/305–315, 257/324, 664, 733, 737, 771, 787, 788; 438/253, 256, 258, 268, 272, 396

(56) References Cited

U.S. PATENT DOCUMENTS

| 3,719,933 A | 3/1973 | Wakabayashi et al. |
| 3,810,127 A | 5/1974 | Hoff, Jr. |
| 4,267,558 A | 5/1981 | Guterman |
| 4,267,583 A | 5/1981 | Suzuki |

(List continued on next page.)

FOREIGN PATENT DOCUMENTS

| DE | 194 40 239 A1 | 4/1998 |
| DE | 196 40 239 A1 | 4/1998 |
| DE | 199 59 904 A1 | 6/2001 |
| EP | 0 268 370 A3 | 5/1988 |

(List continued on next page.)

OTHER PUBLICATIONS

Wolf, Stanley et al, "Silicon Processing for the VLSI Era vol. 2: Process Integration", Lattice Press, 1990, pp. 189–193, and 199–206.*
"A Disrupted Organic Film: Could Memories Be Made of This?," *ORNL Review*, vol. 33, No. 2, 2000.
"Technical Summary of Prgrammable Metallization Cell Memory Technology," Version 1.3, Dec. 2001.
"The 1998 Conference Archieve, " *The Sixth Foresight Conference on Molecular Nanotechnology*, Nov. 12–15, 1998, www.foresight.org/Conferences/MNT6/index.html.
Beck, A. et al., "Reproducuble Switching Effect in Thin Oxide Films for Memory Applications,"*Applied Physics Letters*, vol. 77, No. 1, Pp. 139–141, Jul. 3, 2000.
Bernard, Allen, "A Big Name in Chips Help Coatue in Morecular Memory Race," Aug. 27, 2000, www.nano-elctronicsplanet.com / features/ article/ 0.4028.6571–14528 31.00.html.
Chen, J. et al., "Room–temperature Negative Differential Resistance in Nanoscale Molecular Junctions," *Applied Physics Letters*, vol. 77, No. 8, Aug. 21, 2000.

(List continued on next page.)

*Primary Examiner*—Michael Lebentritt
(74) *Attorney, Agent, or Firm*—Amin & Turocy, LLP

(57) ABSTRACT

A memory device with multi-bit memory cells and method of making the same uses self-assembly to provide polymer memory cells on the contacts to a transistor array. Employing self-assembly produces polymer memory cells at the precise locations of the contacts of the transistor array. The polymer memory cells change resistance values in response to electric current above a specified threshold value. The memory cells retain the resistivity values over time.

17 Claims, 4 Drawing Sheets

U.S. PATENT DOCUMENTS

| | | |
|---|---|---|
| 4,371,883 A | 2/1983 | Potember et al. |
| 4,616,340 A | 10/1986 | Hayashi et al. |
| 4,631,562 A | 12/1986 | Avery |
| 4,652,894 A | 3/1987 | Potember et al. |
| 4,677,742 A | 7/1987 | Johnson |
| 4,727,514 A | 2/1988 | Bhuva et al. |
| 4,733,375 A | 3/1988 | Terashima |
| 4,834,911 A | 5/1989 | Carew |
| 4,839,700 A | 6/1989 | Ramesham et al. |
| 4,860,254 A | 8/1989 | Pott et al. |
| 4,945,257 A * | 7/1990 | Marrocco, III .............. 338/38 |
| 5,012,445 A | 4/1991 | Kazuaki et al. |
| 5,034,192 A | 7/1991 | Wrighton et al. |
| 5,130,380 A | 7/1992 | Carew |
| 5,136,212 A | 8/1992 | Eguchi et al. |
| 5,153,681 A | 10/1992 | Kishimoto et al. |
| 5,196,912 A | 3/1993 | Matsumoto et al. |
| 5,206,525 A | 4/1993 | Yamamoto et al. |
| 5,245,543 A | 9/1993 | Smayling et al. |
| 5,296,716 A | 3/1994 | Ovshinsky et al. |
| 5,315,131 A | 5/1994 | Kishimoto et al. |
| 5,319,564 A | 6/1994 | Smayling et al. |
| 5,355,235 A | 10/1994 | Nishizawa et al. |
| 5,392,236 A | 2/1995 | Hashimoto |
| 5,412,614 A | 5/1995 | Bird |
| RE34,974 E | 6/1995 | Terashima |
| 5,431,883 A | 7/1995 | Barraud |
| 5,440,518 A | 8/1995 | Hazani |
| 5,563,081 A | 10/1996 | Ozawa |
| 5,572,472 A | 11/1996 | Kearney et al. |
| 5,579,199 A | 11/1996 | Kawamura et al. |
| 5,670,818 A | 9/1997 | Forouhi et al. |
| 5,691,935 A | 11/1997 | Douglass |
| 5,698,874 A | 12/1997 | Hayashi |
| 5,734,605 A | 3/1998 | Zhu et al. |
| 5,761,115 A | 6/1998 | Kozicki et al. |
| 5,770,885 A | 6/1998 | McCollum et al. |
| 5,818,749 A | 10/1998 | Harshfield |
| 5,849,403 A | 12/1998 | Aoki et al. |
| 5,869,882 A | 2/1999 | Chen et al. |
| 5,896,312 A | 4/1999 | Kozicki et al. |
| 5,900,662 A | 5/1999 | Frisina et al. |
| 5,914,893 A | 6/1999 | Kozicki et al. |
| 6,047,953 A | 4/2000 | Jacob, Jr. |
| 6,055,180 A | 4/2000 | Gudesen et al. |
| 6,060,338 A | 5/2000 | Tanaka et al. |
| 6,064,589 A | 5/2000 | Walker |
| 6,088,319 A | 7/2000 | Gudesen |
| 6,118,684 A | 9/2000 | Yihong et al. |
| 6,128,214 A | 10/2000 | Kuekes et al. |
| 6,150,705 A | 11/2000 | Chen |
| 6,288,697 B1 | 9/2001 | Eto et al. |
| 6,292,396 B1 | 9/2001 | Tailliet |
| 6,326,936 B1 | 12/2001 | Inganas et al. |
| 6,346,741 B1 * | 2/2002 | Van Buskirk et al. ...... 257/664 |
| 6,349,054 B1 | 2/2002 | Hidaka |
| 6,350,643 B1 * | 2/2002 | Hintermaier et al. ....... 438/240 |
| 6,353,559 B2 | 3/2002 | Hasegawa et al. |
| 6,384,427 B1 | 5/2002 | Yamazaki et al. |
| 6,403,396 B1 | 6/2002 | Gudesen et al. |
| 6,403,397 B1 | 6/2002 | Katz |
| 6,418,049 B1 | 7/2002 | Kozicki et al. |
| 6,424,553 B2 | 7/2002 | Berggren et al. |
| 6,426,891 B1 | 7/2002 | Katori |
| 6,429,457 B1 | 8/2002 | Berggren et al. |
| 6,432,739 B1 | 8/2002 | Gudesen et al. |
| 6,436,762 B1 * | 8/2002 | Tzeng et al. ................ 438/253 |
| 6,449,184 B2 | 9/2002 | Kato et al. |
| 6,459,095 B1 | 10/2002 | Heath et al. |
| 6,461,916 B1 | 10/2002 | Adachi et al. |
| 6,487,106 B1 | 11/2002 | Kozicki |
| 6,509,601 B1 * | 1/2003 | Lee et al. .................... 257/310 |
| 6,559,469 B1 * | 5/2003 | Paz de Araujo et al. ...... 257/15 |
| 6,627,944 B2 * | 9/2003 | Mandell et al. ............. 257/315 |
| 6,656,763 B1 * | 12/2003 | Oglesby et al. ............... 438/99 |
| 2001/0014038 A1 | 8/2001 | Hasegawa et al. |
| 2001/0054709 A1 | 12/2001 | Heath et al. |
| 2001/0055384 A1 | 12/2001 | Yamazaki et al. |
| 2002/0027819 A1 | 3/2002 | Tomanek et al. |
| 2002/0101763 A1 | 8/2002 | Hosogane et al. |
| 2002/0104889 A1 | 8/2002 | Forrest et al. |
| 2002/0125504 A1 | 9/2002 | Perlov et al. |
| 2002/0134979 A1 | 9/2002 | Yamazaki et al. |
| 2002/0163030 A1 | 11/2002 | Mandell et al. |
| 2002/0163057 A1 | 11/2002 | Bulovic et al. |
| 2002/0163828 A1 | 11/2002 | Krieger et al. |
| 2002/0163829 A1 | 11/2002 | Bulovic et al. |
| 2002/0163830 A1 | 11/2002 | Bulovic et al. |
| 2002/0163831 A1 | 11/2002 | Krieger et al. |
| 2002/0168820 A1 | 11/2002 | Kozicki et al. |

FOREIGN PATENT DOCUMENTS

| | | |
|---|---|---|
| EP | 0 385 688 A2 | 9/1990 |
| EP | 0 727 822 A2 | 8/1996 |
| JP | 61107723 | 5/1986 |
| JP | 63293729 | 11/1988 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, H. J. et al., "Reversible, Nanometer–Scale Conductance Transistions ion an Organic COmplex," *Physical Review Letters*, vol. 84, No. 8, pp. 1780–1783, Feb. 21, 2000.

Gao, H. J. et al., "Using a New Kind of Organic Complex System of Electrical Bistability for Ultrahigh Density Data Storage," J. Vac. Sci. Technol. B vol. 15, No. 4, pp. 1581–1583, Jul./Aug. 1997.

International Search Report, PCT/RU01/00334, search completed Feb. 14, 2002.

International Search Report, PCT/US02/14236, search completed Aug. 14, 2002.

International Search Report, PCT/US02/14237, search completed Sep. 9, 2002.

International Search Report, PCT/US02/14238, search completed Aug. 9, 2002.
International Search Report, PCT/US02/14239, search completed Aug. 20, 2002.
International Search Report, PCT/US02/14269, search completed Mar. 27, 2003.
International Search Report, PCT/US02/14270, search completed Mar. 28, 2003.
Japanese patent abstract of publication No. 01–103137, Apr. 20, 1989.
Japanese patent abstract of publication No. 01278781, Nov. 9, 1989.
Japanese patent abstract of publication No. 61107723, May. 26, 1986.
Japanese patent abstract of publication No. 632937269, Nov. 30, 1998.
Krieger, Jr. H. et al., "Molecular Analogue Memory Cell Based on Electrical Switching and Memory in Molecular Thin Films," *Synthetic Metals*, 7730 (2000), pp. 1–4.
Kreiger, Juri h. et al., "Molecular Analogue Memory Cellm" *Sixth Foresight Conference on Molecular Nanotechnology*, Santa Clara, California, Nov. 12–15, 1998.
Krieger, Yu. G. et al., "Stuy of Test Structures of a Molecular Memory Element," *Institute of Inorganic Chamistry*, Siberian Branch, Russian Academy of Sciences. Translated from *Zhumal Strukturnoi Khimii*, vol. 34, No. 6, pp. 152–156, Nov.–Dec. 1993, Original article submitted Apr. 27, 1993.
Krieger, Yu. G., "Moelcular Electronics: Current State and Future Trends," *Journal of Structural Chemistry*, vol. 34, No. 6, pp. 896–904, Nov.–Dec. 1993.
Krieger, Yu. H. "Structural Instability of One–Dimensional Systems as a Physcial Prinicple Underlying the Functioning of Molecular Electronic Devices," *Journal of Structural Chemistrty*, vol. 40, No. 4, pp. 594–619, Jul.–Aug. 1999.
Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp.850–852, Aug. 10, 1998.
Ma, L.P. e al., "Nanometer–Scale Recording on an organic Complex Thin Film With a Scanning Tunneling Microscope," *Applied Physics Letters*, vol. 69, No. 24, pp. 3752–3753, Dec. 9, 1996.
Machida, Yasuhiko et al., "Electrical Switching in Evaporated Lead Phthalocyanie Films," *Japanese Journal of Applied Physics*, vol. 28, No. 2, pp. 297–298, Feb. 1989.
Ovshinsky, Stanford R., "Localized States in the Gap of Amorphous Semiconductors," *Physical Review lEtters*, vol. 36, No. 24, pp. 1469–1472, Jun. 14, 1976.
Potember, R. S. et al., "Electrical Switching and Memory Phenomena in Cu–TCNQ Thin Films," *Applied Physics Letters*, vol. 34, No. 6, pp. 405–407, Mar. 15, 1979.
Reed, M.A. et al., "Molecular Random Access Memory Cell," *Applied Physics Letter*, vol. 78, No. 23, pp. 3735–3737, Jun. 4, 2001.
Rossel, C. et al., "Electrical Current Distribution Across A Metal–Insulator–Metal Structure During Bistable Switching," Apr. 24, 2001.
Rotman, David, "Molecular Memory," *Technology Review*, May 2001.
*Semiconductor Times*, pp. 5–6, Jul. 2002.
Stikeman, Alexandra, "Polymer Memory: The Plastic Path to Better Data Storage," *Technology Review*, p. 31, Sep. 2002.
Zhou, C. et al., "Nanocale Metal/Self–Assembled Monolayer/Metal Heterostructures," *Applied Physics Letters*, vol. 71, No. 5, pp. 611–613, Aug. 4, 1997.

* cited by examiner

MEMORY DEVICE WITH A SELF-ASSEMBLED POLYMER FILM AND METHOD OF MAKING THE SAME

RELATED APPLICATIONS

This application contains subject matter related to the subject matter disclosed in copending U.S. Provisional Patent Application Ser. No. 60/289,054, filed May 7, 2001.

FIELD OF THE INVENTION

The present invention relates to the field of electronic memories, and more particularly, to the structure and formation of a polymer memory.

BACKGROUND OF THE INVENTION

Current computer processing systems operate on binary data wherein a logic one is represented by a high voltage level (approximately $V_{cc}$, typically 3.3 or 5 Volts) and logic 0 is represented by a low voltage level (approximately $V_{ss}$, typically 0 volts or ground). Conventional random access memory cells, such as dynamic (DRAM), charge a cell capacitor to the high voltage level to store a logic one and discharge the capacitor to low voltage level to store a logic zero. During a DRAM read, the voltage on a cell capacitor is differentially sensed against a reference voltage set between $V_{cc}$ and $V_{ss}$ and then, depending on the result, restored by latching the full $V_{cc}$ or $V_{ss}$ level. Data from the cell is similarly output to the periphery and ultimately outside the DRAM device itself by driving various input/output (I/O) lines to approximately $V_{cc}$ or $V_{ss}$.

The ever-increasing memory demands require the storing of more bits per DRAM chip to increase storage capacity. The number of bits per DRAM chip can be increased either by increasing the DRAM cell density (i.e., the number of cells per given chip area), or the DRAM cell capacity (i.e., the number of bits stored in each cell). Increasing the DRAM cell density requires the development of an advanced circuit design and fabrication techniques to pack smaller cells into denser arrays, which is time consuming and requires expensive photolithographic process equipment. Further, as DRAM cells become smaller and the arrays more dense, physical device aspects, such as the charge stored per capacitor, will become limiting factors.

The memory capacity can be increased, for both volatile memory, such as DRAM, and non-volatile memory such as flash memory, by storing multiple bits per cell. In one approach, more than the traditional two voltage levels can be retained in the storage mechanism of a cell with each voltage level representing a different data value. For example, assume that for a given cell, data can be stored as one of four allowed voltage levels. A voltage of 0V can then be used to represent a two-bit logic word "00", a voltage of approximately 1V to represent a logic "01", a voltage of approximately 2V to represent a logic "10" and a voltage of approximately 3V to represent a logic "11". In this fashion, an NSB and a LSB can be stored in a single cell. The exact voltages and the number of voltage levels used depend on the desired design.

The actual implementation of multi-valued memory presents a number of problems. For instance, Murotani et al. (1997 IEEE International Solid State Circuit Conference, Digest of Technical Papers, pp. 74–75, 1997) have proposed a 4-level storage device in which both a most significant bit (MSB) and a least significant bit (LSB) can be stored in a single cell as function of capacitor voltage. The MSB is detected by sensing the stored voltage against a reference voltage that is substantially one-half of $V_{cc}$. After sensing the MSB, the LSB is then sensed against one-half of $V_{cc}$ offset by approximately one-third $V_{cc}$. The sign of the offset (+,−) depends on the MSB (1, 0).

Obtaining an adequate sense signal in such a system disadvantageously requires that the storage capacitor has a large capacitance, which in turn implies a chip area occupied by the storage element or the use of a high dielectric constant material in constructing the capacitor, or possibly a combination of both.

There is a need for providing an elegant circuit for implementing multi-valued storage with efficient use of chip area.

SUMMARY OF THE INVENTION

These and other needs are met by embodiments of the present invention, which provide a method of forming a memory cell comprising forming a first electrode and forming a memory element on the first electrode by self-assembly. The memory element comprises a polymer that forms only on the first electrode and has multiple resistance values that are selectable by exposure of the polymer to an electric field. A second electrode is formed on the first memory element.

The earlier stated needs are also met by other embodiments of the present invention which provide a memory device comprising an addressable array of transistors and a dielectric layer covering the transistor array. A plurality of contacts toward the transistor array are provided through the dielectric layer, with at least some of the contacts being exposed. Memory elements are formed on at least some of the contacts, with the memory elements being formed only on the contacts and not on the dielectric layer. A common electrode is provided that contacts each of the memory elements.

A still further aspect of the present invention provides a method of assembling a memory device, comprising the steps of forming an array of transistors and covering these transistors with a dielectric layer. Conductive contacts to the transistors through the dielectric layer are formed. Memory elements with multiple selectable resistance values are formed on the conductive contacts by self-assembly. A common electrode is formed on the memory elements that contacts to each of the memory elements.

The foregoing and other features, aspects and advantages of the present invention will become more apparent from the following detailed description of the present invention when taken in conjunction with the accompanying drawings.

DETAILED DESCRIPTION OF THE INVENTION

Figure 1:
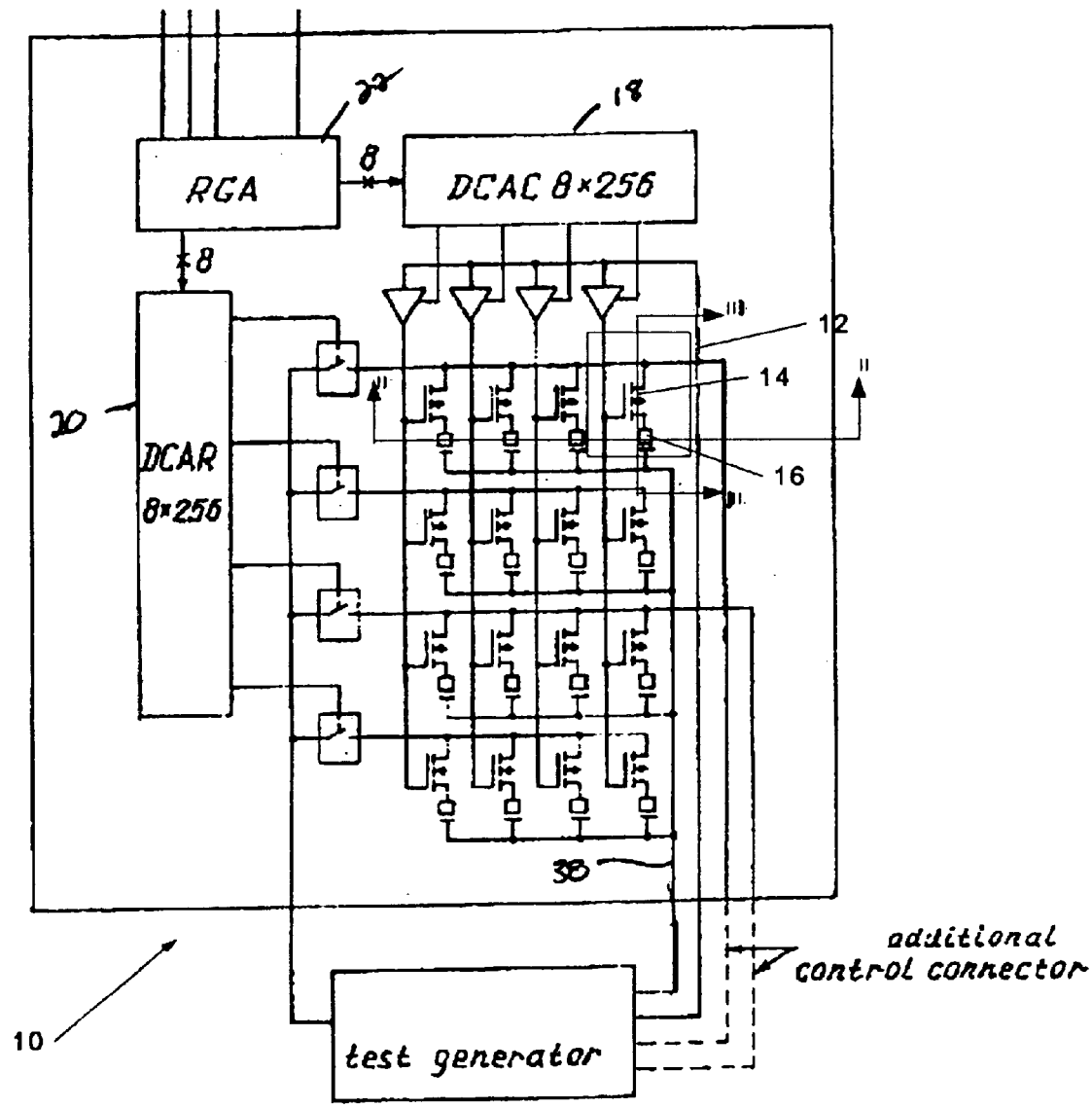
FIG. 1 is a schematic depiction of a memory chip constructed in accordance with an embodiment of the present invention.

The present invention addresses and solves problems related to the formation of memory cells and memory devices, including that of providing a multi-bit memory cell that increases chip density and can be readily assembled. The present invention achieves this, in part, by providing a memory device with an addressable array of transistors, a dielectric layer covering a transistor array, and a plurality of contacts to the transistor arrays through the dielectric layer. Memory elements are formed on the contacts by a self-assembly process. These memory elements, in embodiments of the invention, comprise a material that changes resistance in response to an applied electric field. Multiple resistance values are selectable and settable in these memory elements. The multiple resistance values correspond to multiple-bit values in each memory cell. Exemplary materials employed as the memory elements include polyconjugated polymers, phtalocyanine, and porphyrins. The self-assembly method of forming the memory device provides an efficient and elegant method of creating a highly compact memory device with multiple-bit memory cells.

In a traditional DRAM memory chip, a charge representing a "0" or "1" is stored in a storage capacitor fabricated on a semiconductor wafer. The charge injection into the storage capacitor is controlled by a FET having its source connected to one terminal of the storage capacitor and its drain selectively connected to a power supply, for example, to $V_{ss}$. The other terminal of the storage capacitor can be connected to a common ground. Such devices and their operation are well known in the art. The storage capacitors, the FET's and the interconnects are defined by photolithography, which is an expensive process.

The memory device 10 of the present invention includes a number of DRAM cells 12, with each DRAM cell 12 having a transistor 14 and a memory element 16. In the illustrated exemplary embodiment, a total of sixteen DRAM cells 12 are provided. It should be apparent to those of skill in the art, however, that such an arrangement is exemplary only for illustration purposes. Memory devices having a much larger number of DRAM cells in the memory array may be provided. A column decoder 18 and a row decoder 20 are provided in the memory chip to address the individual memory cells.

An RGA block 22 operates to receive a register address signal (RGA) during a DMA data transfer, for example. This determines the destination for data and generates a dynamic RAM address that selects the location of the data within the memory cells 12.

Each of the memory cells 16 is connected to a common electrode 38 at one terminal, and the other terminal is connected to the transistor 14 in the individual memory cells 12.

The circuitry of the memory device depicted in FIG. 1 is exemplary only as other circuit arrangements can be employed without departing from the scope of the present invention. In such applications, the memory elements typically formed by storage capacitors are replaced with the multi-bit resistance memory elements of the present invention.

Figure 2:
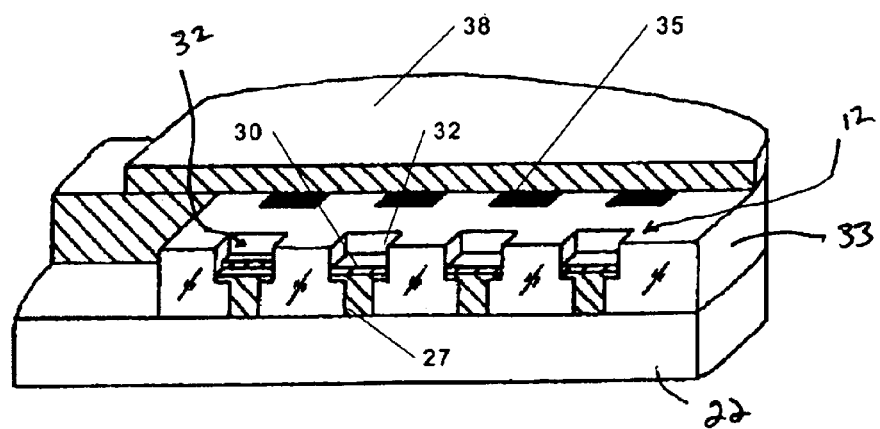
FIG. 2 is a perspective view of a cross-section of a portion of a memory chip in accordance with embodiments of the present invention during one step of the assembly process.

FIG. 2 depicts a cross-sectional perspective view of a portion of the memory chip taken along the cross-section III—III, but without the memory elements 16.

An exemplary FET is formed on a P-type silicon substrate 22 and the transistor array is formed within and on the substrate 22. Note that the transistors are not depicted in substrate 22 in FIG. 1 for illustration purposes. Only the contacts 27 {or conductive plugs} are depicted. These conductive plugs 27 extend to a dielectric layer 33 and end at a recess 32. In practice, the conductive plugs 27 may comprise any suitable conductive material, such as aluminum or copper, for example. In the embodiment described below, it is assumed, however, that the conductive plug 27 comprises aluminum. A barrier layer 30 is provided on top of the conductive plug 27 and will be described in further detail below. Barrier layer 30 comprises a material that prevents interaction between the conductive plug 27 and an adhesion layer that will be formed above the barrier layer 30.

A common electrode 38 covers the memory cells 12, although the electrode is not depicted in FIG. 1 as covering the cells 12 so as not to obscure the underlying structure.

Figure 3:
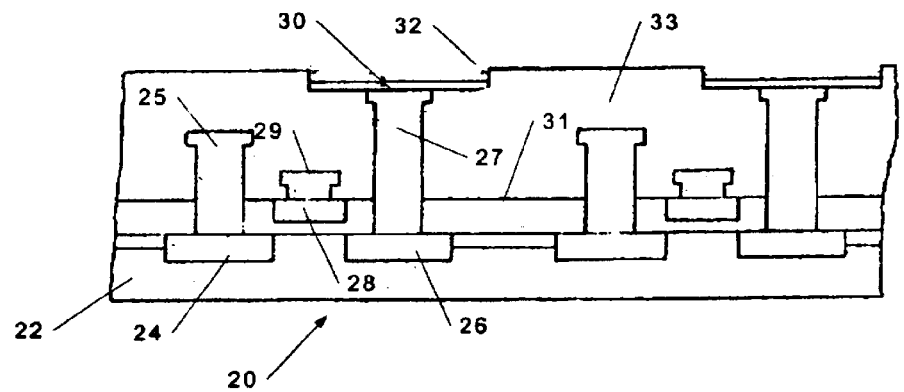
FIG. 3 is a side view of the memory array of FIG. 2, during one step of the assembly process in accordance with embodiments of the present invention.

Referring now to FIG. 3, a cross-section of the substrate 22, including the formation of the transistors and the transistor array, is depicted. Source and drain regions 24, 26 are provided along with a gate electrode 28 in the transistors. Contacts 25, 29, 27 are shown as extending to the various elements of the transistors. A gate dielectric layer, such as silicon oxide, is referenced with reference numeral 31. As depicted in FIG. 3, the conductive plugs 27 extend from a drain 26, for example, and terminate at the opening of a recess 32 in the dielectric layer 33. Conventional methodology forming the transistor array to this point may be employed.

Figure 4:
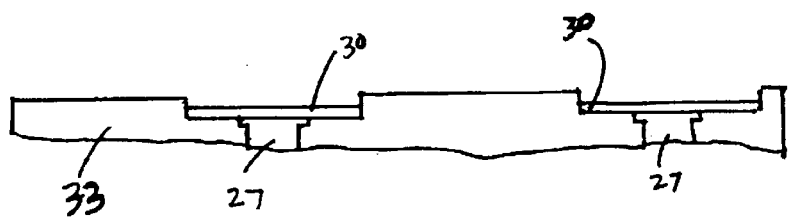
FIG. 4 shows the structure of FIG. 3 following the deposition of a barrier layer on the conductive plug, in accordance with embodiments of the present invention.

A barrier layer 30 as described earlier, is formed on top of the connective plugs 27, as depicted in detail in FIG. 4. The barrier layer 30 comprises a material that prevents interaction between the material of the conductive plug 27 and the adhesion layer or the polymeric material that will be subsequently deposited above it. In embodiments of the invention in which the conductive plug 27 comprises aluminum, the barrier layer 30 may comprise tungsten, for example. Other materials suitable for use as a barrier layer may be employed without departing from the scope of the invention. The barrier layer 30 needs to be conductive, however.

Figure 5:
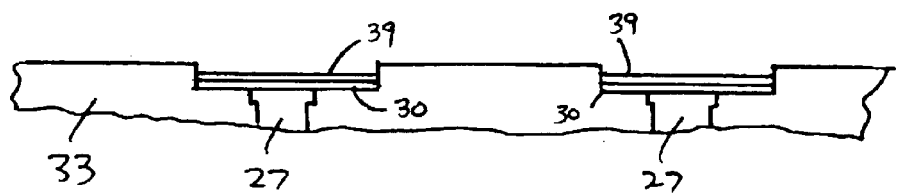
FIG. 5 depicts the structure of FIG. 4, following the deposition of an adhesion layer on the barrier layer, in accordance with embodiments of the present invention.

Following the deposition of a barrier layer 30 by evaporation, for example, to a thickness of approximately 100 Å, for example, a thin adhesion layer 39 is provided on the barrier layer 30 in certain embodiments of the present invention. This is depicted in detail in FIG. 5. The choice of material for the adhesion layer 39 is made so that the molecular film that will be deposited on the adhesion layer 39 will adhere to the adhesion layer 39 and not to the dielectric layer 33. For example, assuming the conductive plug 27 comprises aluminum, and the barrier layer 30 comprises tungsten, as in the exemplary embodiment, an adhesion layer 39 of copper is suitable to serve as an adhesion layer for a number of different molecular films, such as polymethylphenylacetylene, or cupperphtalocyanine. Hence, this specific choice of the thin adhesion layer

39 is dependent upon the molecular film that will be employed. The self-assembly method is employed to cause the molecular and polymer film to adhere only to the adhesion layer 39 and not to the dielectric layer 33. This places the memory elements at precise locations on the contacts connecting to the transistor array.

As will be described in more detail later, the particular molecular films that are deposited by self-assembly in the present invention have the property of exhibiting a resistivity that is controllably adjustable in response to electric field or current. Once set into a particular resistance state, the memory element will retain that state for a period of time unless the resistance value is erased.

In order to self-assemble the molecular film on the adhesion layer 39, in embodiments of the invention the memory array or memory device is located in a relatively large volume or chamber or a small volume with a liquid monomer is provided. A monomer gas is also provided in the large volume. The memory cell or memory device is held within this chamber for a period of time, such as three hours, and maintained at a desired temperature range, such as at approximately room temperature. These values are exemplary only as other values may be used depending upon the particular materials employed.

A number of different materials may be used as the molecular and polymer film. In certain embodiments of the invention, the material is a conjugated polymer. In certain other embodiments, the material is a phtalocyanine. In other embodiments of the invention, the material is a porphyrin. These materials are described in an article by one of the inventors of the present application, entitled "*Structural Instability of One-dimensional Systems as a Physical Principal Underlying the Functioning of Molecular Electronic Devices,*" Journal of Structural Chemistry, Vol. 40, No. 4, 1999 (Ju. H. Krieger). This reference is hereby expressly incorporated by reference into the present application.

Figure 8:
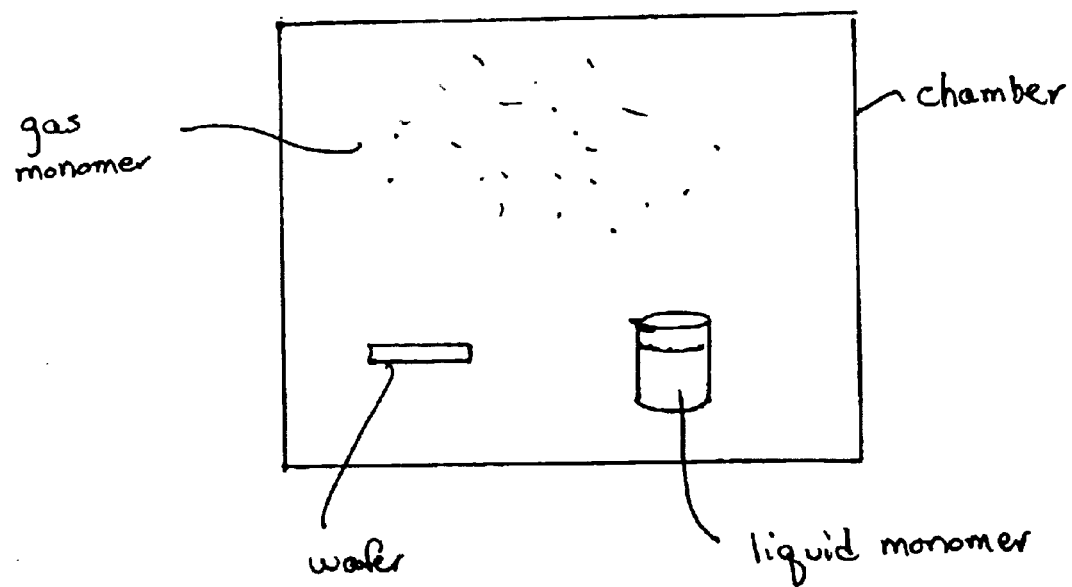
FIG. 8 is a schematic depiction of the self-assembly process, in accordance with embodiments of the present invention.

In order to deposit the polymer on the adhesion layer, the present invention provides a self-assembly method in which the memory device or memory cell is placed in a large chamber, as in FIG. 8, in which a gas monomer is provided. A relatively small volume of liquid monomer 52 is also placed in the chamber 50. In exemplary embodiments of the invention, the monomer is methylphenylacetylene. The polymerization creates a polymeric film of the conjugated polymer that takes place at the gas, solid interface. This permits forming polymer films from a monomer onto a non-flat and complicated surface, in this case, the contacts of the transistor array.

Figure 6:
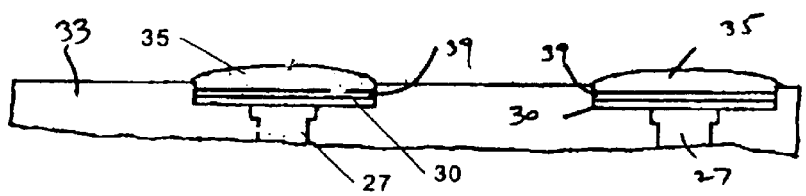
FIG. 6 shows the structure of FIG. 5, following the deposition of a polymer memory element on a conductive contact, formed by self-assembly, in accordance with embodiments of the present invention.

In the exemplary embodiment of a monomer of methylphenylacetylene, a conjugated polymeric film of polymethylphenylacetylene is produced, typically with a thickness of approximately 1000 Å after the memory cell or memory device has been held in the chamber 50 at room temperature for approximately three hours. The film 35 is depicted in FIG. 6.

In other embodiments of the invention, the polymeric film 35 that is formed is cupperphtalocyanine. In these embodiments, the monomer gas that is used is tetracyanobenzene.

These polymeric films and monomers are exemplary only, as those that are skilled in the art will recognize that other polymeric films and monomers for creating such films may be employed without departing from the scope of the invention. As examples of polyconjugated polymers useful in the present invention, the following may be employed: polyparaphenylene, polyphenylvenyene, polyaniline, polythiophene or polypyrrole.

Figure 7:
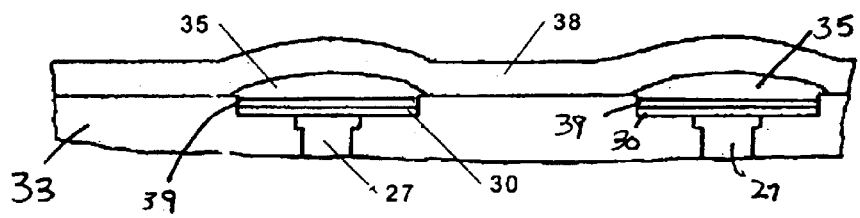
FIG. 7 depicts the structure FIG. 6, following the formation of a common electrode over the memory elements, in accordance with embodiments of the present invention.

As depicted in FIG. 7, after the deposition of the polymer by self-assembly on the conductive contacts to the transistor array, a common electrode is formed over each of the contacts 35. The common electrode 38 may be any suitable conductive material, such as aluminum, tungsten, gold, copper, etc. The common electrode 38 may be formed by evaporation, for example.

Once assembled, the memory cells of the present invention have the characteristic that they can assume different resistivity levels in response to the application of electric fields or current. For example, by proper application of a write current, the memory cell is impressed with different selected resistivities. For example, these resistivity levels may be 300 ohms, corresponding to a "00" value, approximately 400 ohms, corresponding to a "01" value, and approximately 650 alms, corresponding to a "11" value. These different resistivity levels are achieved by providing different write currents to the memory cell.

Figure 9:
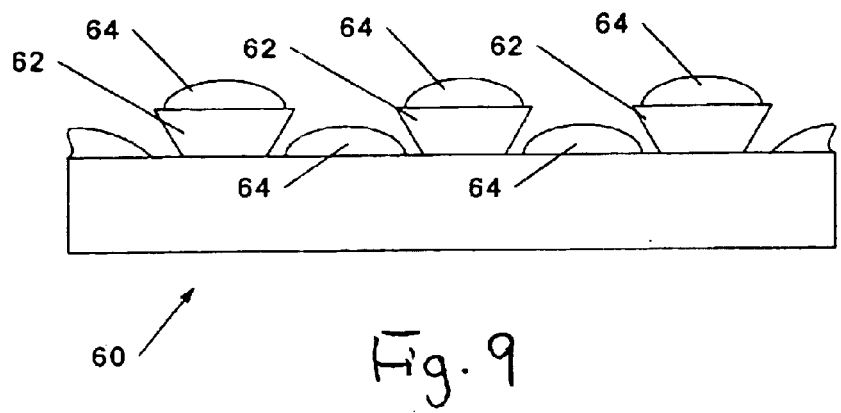
FIG. 9 depicts a schematic-cross-section of a self-assembled conductive path arrangement, in accordance with embodiments of the present invention.

In addition to its use in forming a memory device, the self-assembly method of the present invention may also be employed to form connecting pads and paths having a reversibly programmable resistance. For example, as seen in FIG. 9, a silicon substrate 60 is etched to provide an overhanging rib 62. The overhang can be produced by conventional techniques such as anisotropic chemical etching or ion beam milling. Depositing layer 64 of the exemplary molecular composite material on the surface creates a plurality of electrically isolated pathways to be formed, without requiring photolighographic processes. Such pathways can provide novel ways to selectively interconnect different devices on a chip, since the resistivity of these pathways can be reversibly changed between an "off" state and an "on" state by applying an external electric field or flowing an electric current through the pathway.

The present invention as described above, provides a memory device that may be readily assembled by self-assembly, and produces multi-bit memory cells on a conventional transistory array. This increases the effective bit storage density of a memory device. The self-assembly method allows polymers of the memory cells to be precisely located at each of the contacts of the transistor array.

Although the present invention has been described and illustrated in detail, it is to be clearly understood that the same by way of illustration and example only and is not to be taken by way of limitation, the scope of the present invention being limited only by the terms of the appended claims.

What is claimed is:

1. A memory device, comprising:
   an addressable array of transistors;
   a dielectric layer covering the transistor array;
   a plurality of contacts to the transistor array through the dielectric layer with at least some of the contacts exposed, the exposed contacts comprising a conductive plug extending from the transistor towards a top surface of the dielectric layer, a barrier layer on a top of the conductive plug, and an adhesion layer on the barrier layer;
   memory elements on at least some of the contacts, with the memory elements being formed only on the contacts and not on the dielectric layer; and
   a common electrode contacting each of the memory elements.

2. The memory device of claim 1, wherein the contacts include a first conductive material contacting the transistor and extending through the dielectric layer.

3. The memory device of claim 2, wherein the memory elements comprise a material that changes resistance in response to an applied electric field.

4. The memory device of claim 3, wherein the material is capable of being set to and remaining at one of at least three distinct resistance values.

5. The memory device of claim 4, wherein the material has the property of adhering only to the contacts and not to the dielectric layer.

6. The memory device of claim 4, wherein the material is a polyconjugated polymer.

7. The memory device of claim 6, wherein the polyconjugated polymer is at least one of: polyparaphenylene, polyphenylvinylene, polyanilinie, polythiophene, or polypyrrole.

8. The memory device of claim 4, wherein the material is a polymeric phtalocyanine.

9. The memory device of claim 4, wherein the material is a polymeric porphyrin.

10. The memory device of claim 1, wherein the conductive plug comprises aluminum.

11. The memory device of claim 10, wherein the barrier layer comprises tungsten.

12. The memory device of claim 11, wherein the adhesion layer comprises copper or a copper alloy.

13. The memory device of claim 12, wherein the material is a polyconjugated polymer.

14. The memory device of claim 12, wherein the material is a polymeric phtalocyanine.

15. The memory device of claim 12, wherein the material is a polymeric porphyrin.

16. The memory device of claim 12, wherein the material is at least one of a polyconjugated polymer, a polymeric phtalocyanine, or a polymeric porphyrin.

17. The memory device of claim 16, wherein the common electrode comprises aluminum.

* * * * *